United States Patent
Strocchia-Rivera

(10) Patent No.: US 9,972,548 B2
(45) Date of Patent: May 15, 2018

(54) FINFET ELECTRICAL CHARACTERIZATION WITH ENHANCED HALL EFFECT AND PROBE

(71) Applicant: GLOBALFOUNDRIES Inc., Grand Cayman (KY)

(72) Inventor: Carlos Strocchia-Rivera, Highland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 79 days.

(21) Appl. No.: 15/051,791

(22) Filed: Feb. 24, 2016

(65) Prior Publication Data
US 2017/0030849 A1 Feb. 2, 2017

Related U.S. Application Data

(60) Provisional application No. 62/197,149, filed on Jul. 27, 2015.

(51) Int. Cl.
*G01R 27/08* (2006.01)
*H01L 21/66* (2006.01)

(52) U.S. Cl.
CPC .............. *H01L 22/14* (2013.01); *G01R 27/08* (2013.01)

(58) Field of Classification Search
CPC ..... H01L 27/228; H01L 43/08; H01L 29/785; H01L 27/0886; H01L 29/66803; H01L 21/02532; H01L 29/0673; H01L 23/5223; H01L 23/5227; H01L 29/42392; H01L 21/32137; H01L 21/845; H01L 22/20; H01L 29/165; H01L 29/517; H01L 29/7853; H01L 29/82; H01L 22/12; H01L 29/78681; H01L 21/0206; H01L 21/02576; H01L 21/02579; H01L 29/786; H01L 21/02112; H01L 21/02175; H01L 21/26546; H01L 21/30625; H01L 21/3086; H01L 27/0203; H01L 27/13; H01L 27/14; H01L 27/22; H01L 2924/1206; H01L 2924/14; H01L 2924/1427; H01L 29/41791; H01L 29/42344; H01L 29/42348; H01L 29/4966; H01L 29/513; H01L 29/66477; H01L 29/7842; H01L 29/7845; G01R 27/32; G01R 29/08; G01R 29/0857; G01R 29/0878; G01R 29/24;
(Continued)

(56) References Cited

U.S. PATENT DOCUMENTS 8,859,358 B2 * 10/2014 Wang .................. H01L 29/7784
257/208
2010/0066348 A1 * 3/2010 Merz ..................... C12Q 1/6869
324/71.1

(Continued)

*Primary Examiner* — Vinh Nguyen
(74) *Attorney, Agent, or Firm* — Ditthavong & Steiner, P.C.

(57) ABSTRACT

A method of proving inline characterization of electrical properties of a fin-shaped field effect transistor (finFET) is provided. Embodiments include applying an electrical current along a length of at least one fin of a finFET disposed over a wafer surface; generating a magnetic field across a width of the at least one fin, wherein the magnetic field is perpendicular in direction to the electrical current; and detecting electron flow concentrated at an upper portion of the at least one fin.

20 Claims, 5 Drawing Sheets

(58) Field of Classification Search
CPC .. G01R 33/06; G01R 33/066; G01N 2223/61; G01N 2223/6116; G01N 23/223; G01N 23/2206; G01N 23/2208
See application file for complete search history.

(56) References Cited

U.S. PATENT DOCUMENTS

| | | | |
|---|---|---|---|
| 2012/0154019 A1* | 6/2012 | Curatola | G01R 33/06 327/530 |
| 2015/0294863 A1* | 10/2015 | Nemani | H01L 21/0228 438/780 |
| 2016/0005839 A1* | 1/2016 | Yieh | H01L 29/66803 438/506 |

* cited by examiner

FINFET ELECTRICAL CHARACTERIZATION WITH ENHANCED HALL EFFECT AND PROBE

RELATED APPLICATION

The present application claims priority to Provisional Application No. 62/197,149, filed on Jul. 27, 2015, which is incorporated herein by reference in its entirety.

TECHNICAL FIELD

The present disclosure relates to the characterizing of electrical properties of semiconductor devices. In particular, the present disclosure relates to inline characterization of electrical properties of fin-shaped field effect transistor (finFET) devices.

BACKGROUND

Inline characterizations of finFETs are extremely challenging given the increasingly small dimensions of finFETs. Electrical characterizations are most relevant to final performance of finFETs. Existing technology, such as standard inline characterizations with optical or X-ray illuminations are challenged since the dimensions of finFETs are becoming very small fractions of the illumination wavelengths. Critical dimension atomic force microscopy (CD-AFM) measurements can only scan small regions of one (or a few) finFETs, and can only provide topographical information of the finFETs. Critical dimension scanning electron microscope (CD-SEM) measurements have limited precision and can only provide dimensional information. Further, transmission electron microscopy (TEM) is destructive to the finFET and can only provide a very limited area of electrical characterization. Ellipsometry and scatterometry are limited by the very small fraction of device sizes to the irradiation wavelengths. X-ray systems are challenged by the increasingly small amount of material for interaction with the X-rays.

A need therefore exists for methodology enabling precise inline characterization of small finFETs without destruction of the finFETs, as early in the manufacturing process as possible.

SUMMARY

An aspect of the present disclosure includes providing a small test region (compatible with product wafer kerfs) of parallel fins of a finFETs connecting two or more sufficiently large contact areas. The contact areas allow electrical contacts and sensing contacts to be established with the finFETs serving as the connection for longitudinal current flow along the finFETs. This configuration allows for electrical characterization of the finFETs. The application of a perpendicular magnetic field at a relatively low angle with respect to the wafer surface such that Lorentz forces force the electron flow towards the upper area of the finFET. The magnetic field strength can be fixed or varied to characterize the finFET response to current flow at various fractions of the finFET volume (e.g. mostly top, middle to top, bottom to top). Additionally source/drain voltage can be varied to further effect varying electron flow in the finFET.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: applying an electrical current along a length of at least one fin of a finFET disposed over a wafer surface; generating a magnetic field across a width of the at least one fin, wherein the magnetic field is perpendicular in direction to the electrical current; and detecting electron flow concentrated at an upper portion of the at least one fin.

Aspects of the present disclosure include the electrical current flows with gradually decreasing strength as a depth of the at least one fin increases. Other aspects include the electrical current at the upper portion has a higher electric current than a lower portion of the at least one fin closer to the wafer surface. Further aspects include the electrical current applied with a first surface contact probe of a probe device. Additional aspects include the detecting of the electron flow includes a second surface contact probe of the probe device positioned adjacent to the upper portion of the at least one fin. Other aspects include generating the magnetic field at a low angle relative to the wafer surface to force the electrical current to flow towards the upper portion of the at least one fin by way of Lorentz forces. Additional aspects include the magnetic field being fixed. Another aspect includes the magnetic field being varied. Yet another aspect includes determining a resistance or conductance value of the at least one fin. Other aspects include applying the electrical current along a length of parallel silicon fins of the finFET disposed over a wafer surface. Further aspects include the finFET further including source/drain regions disposed at ends of the at least one fin, and adjusting source/drain voltage in the source/drain regions to effect the flow of the electrical current in the at least one fin.

Another aspect of the present disclosure is a method including: applying an electrical current along a length of silicon fins of a finFET disposed over a wafer surface; generating a magnetic field across a width of the at least one fin, wherein the magnetic field is perpendicular in direction to the electrical current and the magnetic field at a low angle relative to the wafer surface to force the electrical current to flow towards the upper portion of the at least one fin; detecting electron flow concentrated at an upper portion of each of the silicon fins with a probe device; and determining a resistance or conductance value of the silicon fins.

Aspects of the present disclosure include the electrical current flows with gradually decreasing strength as a depth of the at least one fin increases. Other aspects include the electrical current at the upper portion having a higher electric current than a lower portion of the at least one fin closer to the wafer surface. Further aspects include the electrical current being applied with a first surface contact probe of a probe device. Additional aspects include detecting the electron flow with a second surface contact probe of the probe device positioned adjacent to a source/drain of the at least one fin. Other aspects include generating the magnetic field at the low angle relative to the wafer surface to force the electrical current to flow towards the upper portion of the silicon fins. Additional aspects include generating of the magnetic field by generating the magnetic field at the low angle relative to the wafer surface to force the electrical current to flow towards a source/drain of the at least one fin, wherein the magnetic field is fixed or varied. Additional aspects include maximizing a strength of at least one of the magnetic field or electron speed of the electrical current; gradually reducing the strength of the at least one magnetic field or electron speed of the electrical current; and measuring a resistance of the finFET as more volume is included in the resistance measurement. Further aspects include source/drain regions disposed at ends of the silicon fins, and adjusting source/drain voltage in the source/drain regions to affect the flow of the electrical current in the silicon fins.

Another aspect of the present disclosure is a method including: applying an electrical current along a length of silicon fins of a finFET disposed over a wafer surface, wherein an upper portion of the silicon fins receives a higher electric current of the electrical current than a lower portion of the silicon fins; generating a magnetic field across a width of the at least one fin, wherein the magnetic field is perpendicular in direction to the electrical current, and the magnetic field is generated at a low angle relative to the wafer surface to force the electrical current to flow towards the upper portion of the silicon fins; and detecting electron flow concentrated at an upper portion of each of the silicon fins with a multiple point probe device.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

The present disclosure addresses and solves the current problems of imprecise characterizations of electrical properties of finFETs and/or destruction of the finFETs attendant upon measuring electrical properties of the finFETs by current techniques. These problems are solved by using the Hall Effect phenomena on current flow to concentrate electron flow into the upper region of the finFETs. Electron flow through this region will then allow for accurate characterization of this critical region of finFETs.

Methodology in accordance with embodiments of the present disclosure includes applying an electrical current along a length of at least one fin of a finFET disposed over a wafer surface; generating a magnetic field across a width of the at least one fin, wherein the magnetic field is perpendicular in direction to the electrical current; and detecting electron flow concentrated at an upper portion of the at least one fin.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
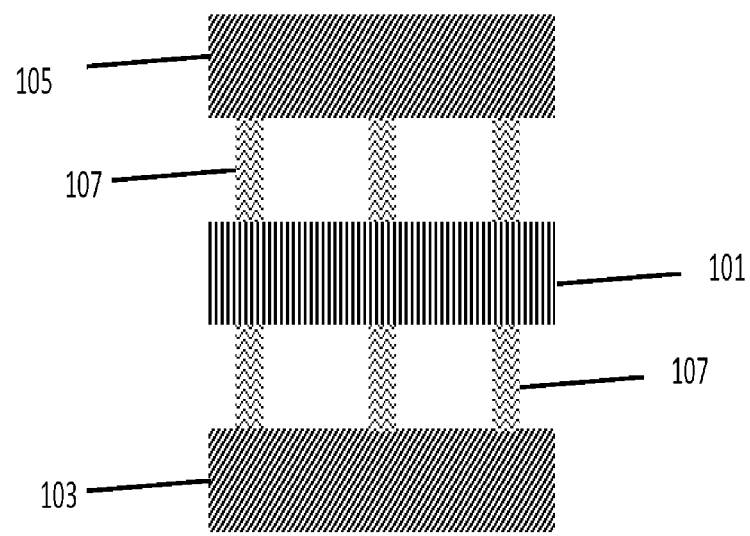
FIG. 1 illustrates a top view of a finFET, in accordance with an exemplary embodiment.

Adverting to FIG. 1, an example of a finFET is shown from a top view. Gate 101 is optionally positioned between source 103 and drain 105 regions. Silicon fins 107 extend from the source 103 to the drain 105 under the optional gate 101. The thickness of each of the fins 107 (measured in the direction from source 103 to drain 105) determines the effective channel length of the device. Other finFET architecture can be used with the present disclosure. Indeed, any fin-based, multi-gate transistor architecture in all technology nodes can be characterized with the methodology of the present disclosure.

Figure 2A:
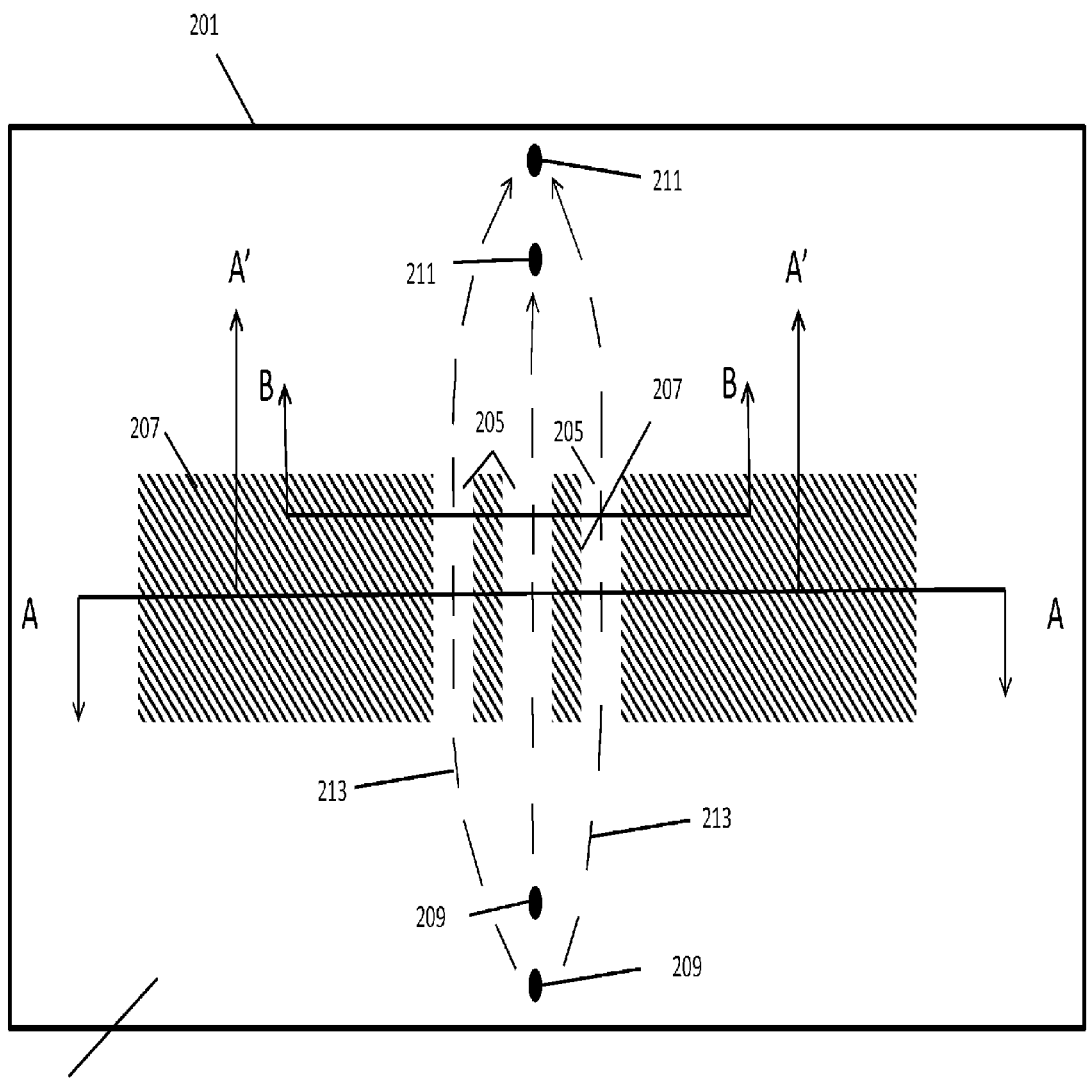
FIG. 2A illustrates a top view of a Si wafer containing fins for electrical characterization, in accordance with an exemplary embodiment.
Figure 2B:
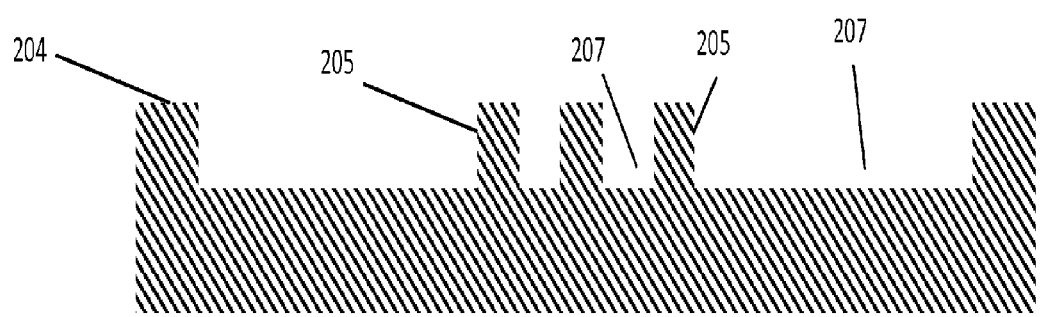
FIG. 2B illustrates the Si wafer along line A-A of FIG. 2A.

Adverting to FIG. 2A a top view over a flat surface of a silicon (Si) wafer is illustrated. The regions 207 represent areas etched in the Si surface to form the fins 205 of the finFET. A cross sectional view of the Si surface 204, along line A-A is illustrated in FIG. 2B. In FIG. 2B, the fins 205 are formed over the Si surface in trench 207. Reverting to FIG. 2A, multiple surface contact probes 209 and 211 are illustrated on sides of the fins 205. One or more surface contact probes 209 provide an electrical current 213 represented by directional lines passing through one side of the fins 205 and exiting the second side. One or more surface contact probes 211 are positioned on the opposite side of the fins 205 receive the electrical current 213 driven through the body of the fins 205. In this example the fins 205 are approximately 14 nm in size. The test structure 201 in this example is within a kerf (i.e., a region that is cut/sawed between adjacent chips on a wafer surface). The characterization of the area of the Si surface in this unused region adjacent the kerf avoids having to use the active device areas of the chips formed on the wafer surface.

Figure 3:
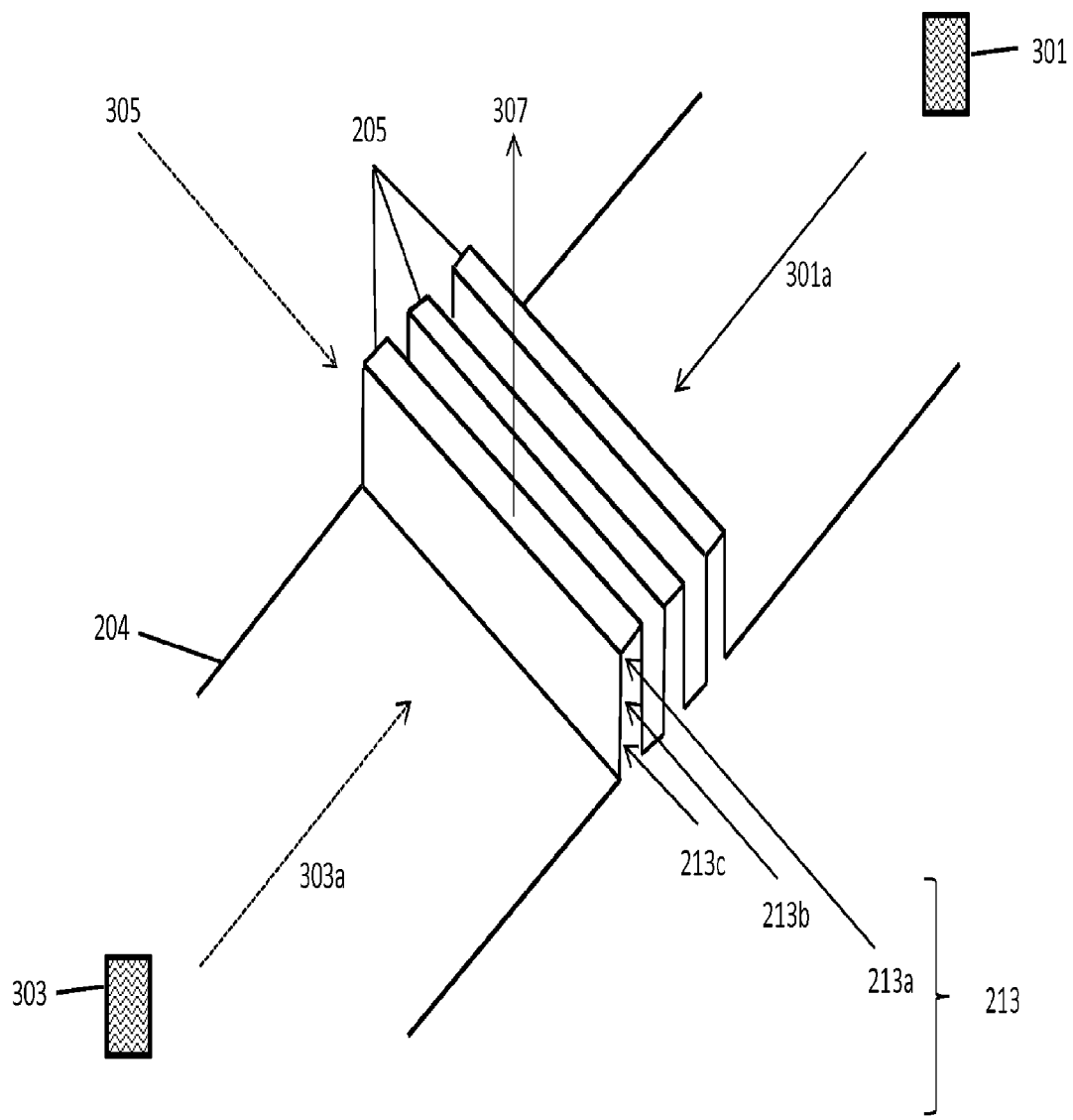
FIG. 3 illustrates an elevated perspective view of a test structure between cross-sections B-B and A'-A' containing fins for electrical characterization, in accordance with an exemplary embodiment.

Adverting to FIG. 3, an inclined perspective view of a test structure 201 with Si surface 204 and fins 205 is illustrated. FIG. 3 illustrates an elevated perspective view of a test structure between cross-sections B-B and A'-A' (FIG. 2A) containing fins for electrical characterization. In this example, the electrical current 213 (213a, 213b, 213c) is applied on a first side of the fins 205. The electrical current 213 naturally varies with depth of the fins 205 when applied at the surface. Electrical current 213a is the strongest (highest charge) compared to electrical current 213b and 213c. The amount of the electrical current will vary depending on the dimensions of the fins 205 and/or subsequent processing such as ion implantation or stress film application. Electrical current 213c is the weakest (lowest charge) out of the applied electrical currents. The source of the electrical current 213a, 213b, and 213c is provided by a probe device containing multiple surface contact probes. For example, one or ore of the surface contact probes 209 in FIG. 2 can be associated with a micro probe device. Multipoint devices using microprobe metrology can be used. One or more surface contact probes 211 are configured with a sensing contact to receive the electrical current 213a, 213b, and 213c at the opposite side of the fin 205.

The current 213 enters the fin and travels upwards away from the Si surface 204 as shown by directional arrow 307 in the presence of a perpendicular, low angle magnetic field. The position of the contact probes can also be reversed such that current is applied along directional arrow 305 on the one side of the fin 205 by contact probe 209 and contact probes 211 can be placed on the opposite side of the fin 205. The movement of the electrical current in the upward direction of the fin 205 is due to a Hall Effect. Current flow direction can also be reversed by electrical reversal of polarity of the surface contact probes.

In addition to the electrical current, a magnetic field 301 is generated across a width of the fin 205 along directional arrow 301a or, alternatively a magnetic field 303 is generated along directional arrow 303a. The magnetic field 301 or 303 is perpendicular in direction to the electrical current 213. The magnetic field 301 or 303 can be fixed or varied. The magnetic field 301 or 303 is applied at a low angle relative to the Si surface 204 to force the electrical current 213 to flow towards the upper portion of the at least one fin 205. The low angle at which the magnetic field 301 or 303 is relative to the Si surface 204. Lorentz force is the force that is exerted by the magnetic field 301 or 303 on a moving electric current. Thus, the magnetic field 301 or 303 assists the electrons of the electrical current to continue in their movement to the upper portion of the fin 205. Additionally source/drain voltage of the source 103 and drain 105 regions can be varied to further effect varying electron flow in the fin(s) of the finFET.

Figure 4A:
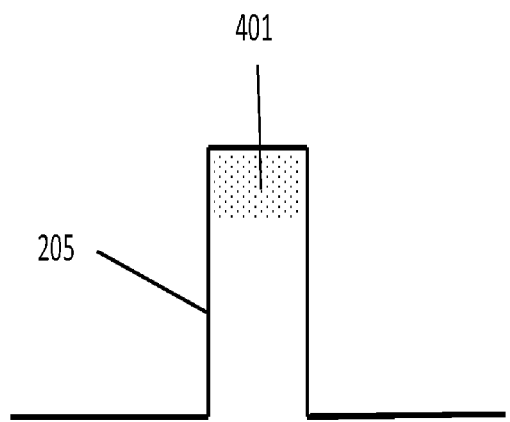
FIGS. 4A, 4B and 4C illustrate cross sectional views of a fin with a concentrated electrical current in its upper portion.
Figure 4B:
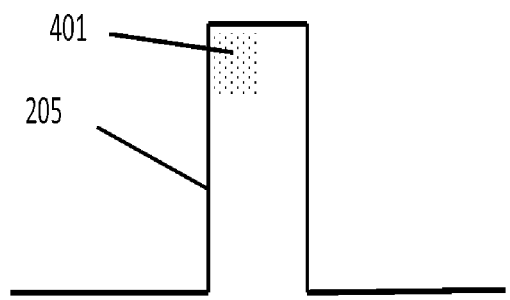
Figure 4C:
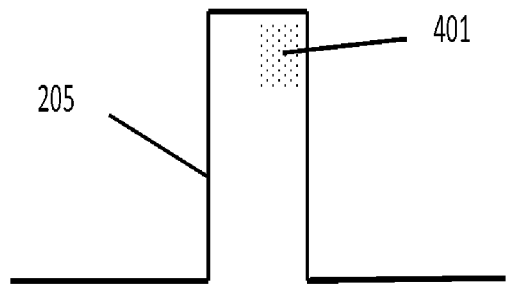

FIG. 4A illustrates, in cross section, the electrical current concentrated in an upper portion 401 of fin 205. The electrical current is concentrated at an upper portion 401 of the fin 205 due to a Hall Effect. FIGS. 4B and 4C illustrate that the electrical current can be confined to one side 401 or the other of the fin 205 due to a magnetic field orientation not parallel to the wafer surface. The resistance in the upper region 401 of the fin is ideal for calculating the resistivity (or conductance) in this critical region of the fin to determine the overall operational performance of the finFET. Electrical characterizations are most relevant to final operational performance.

The resistivity of the finFET can be altered by subsequent processing and repeated measurements of the finFET resistivity. Resistivity can be determined by prior processing and prior to finFET formation. In this manner, processing such as ultra-shallow junctions could be characterized.

One method to characterize resistivity depth profile is to maximize the magnetic filed strength and/or electron speed. Such maximizations will maximize Lorentz forces which will constrain to a region very close to the surface. By gradual reductions of magnetic filed strength and/or electron speed, more and more of the known volume of the finFET will be included in the measured resistance. The initial measured near surface resistance (or conductance) can be then factored out to reveal the resistance of the added volume of the finFET.

Devices tested and characterized in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the characterizing of the finFET devices prior to their incorporation in any of various types of highly integrated semiconductor devices. The present disclosure is applicable to all technology nodes using finFETs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    applying an electrical current along a length of at least one fin of a fin-shaped field effect transistor (finFET) disposed over a wafer surface;
    generating a magnetic field across a width of the at least one fin, wherein the magnetic field is perpendicular in direction to the electrical current; and
    detecting an electron flow of the electrical current concentrated at an upper portion of the at least one fin.

2. The method according to claim 1, wherein the electrical current flows with gradually decreasing strength as a depth of the at least one fin increases.

3. The method according to claim 2, wherein the electrical current at the upper portion has a higher electric current than a lower portion of the at least one fin closer to the wafer surface.

4. The method according to claim 3, wherein the electrical current is applied with a first surface contact probe of a probe device.

5. The method according to claim 4, wherein the detecting of the electron flow includes:
    a second surface contact probe of the probe device positioned adjacent to the upper portion of the at least one fin.

6. The method according to claim 1, wherein the generating of the magnetic field includes:
    generating the magnetic field at a low angle relative to the wafer surface to force the electrical current to flow towards the upper portion of the at least one fin b way of Lorentz forces.

7. The method according to claim 6, wherein the magnetic field is fixed.

8. The method according to claim 6, wherein the magnetic field is varied.

9. The method according to claim 1, further comprising:
    determining a resistance or conductance value of the at least one fin.

10. The method according to claim 1, further comprising:
    applying the electrical current along a length of parallel silicon fins of the finFET disposed over a wafer surface.

11. The method according to claim 1, wherein:
    the finFET further comprises source/drain regions disposed at ends of the at least one fin, and
    adjusting source/drain voltage in the source/drain regions to effect the flow of the electrical current in the at least one fin.

12. A method comprising:
    applying an electrical current along a length of silicon fins of a fin-shaped field effect transistor (finFET) disposed over a wafer surface;
    generating a magnetic field across a width of the at least one fin, wherein the magnetic field is perpendicular in direction to the electrical current and the magnetic field at a low angle relative to the wafer surface to force the electrical current to flow towards the upper portion of the at least one fin;

detecting an electron flow of the electrical current concentrated at an upper portion of each of the silicon fins with a probe device; and determining a resistance or conductance value of the silicon fins.

13. The method according to claim 12, wherein the electrical current flows with gradually decreasing strength as a depth of the at least one fin increases.

14. The method according to claim 13, wherein the electrical current at the upper portion has a higher electric current than a lower portion of the at least one fin closer to the wafer surface.

15. The method according to claim 14, wherein the electrical current is applied with a first surface contact probe of a probe device.

16. The method according to claim 15, wherein the detecting of the electron flow includes:

a second surface contact probe of the probe device positioned adjacent to a source/drain of the at least one fin.

17. The method according to claim 12, wherein the generating of the magnetic field includes:

generating the magnetic field at the low angle relative to the wafer surface to force the electrical current to flow towards a source/drain of the at least one fin, wherein the magnetic field is fixed or varied.

18. The method according to claim 12, further comprising:

maximizing a strength of at least one of the magnetic field or electron speed of the electrical current;

gradually reducing the strength of the at least one magnetic field or electron speed of the electrical current; and measuring a resistance of the finFET in greater volume in a sequential manner to characterize a resistance profile of the finFET.

19. The method according to claim 12, further comprising:

source/drain regions disposed at ends of the silicon fins, and adjusting source/drain voltage in the source/drain regions to effect the flow of the electrical current in the silicon fins.

20. A method comprising:

applying an electrical current along a length of silicon fins of a fin-shaped field effect transistor (finFET) disposed over a wafer surface, wherein an upper portion of the silicon fins receives a higher electric current of the electrical current than a lower portion of the silicon fins;

generating a magnetic field across a width of the at least one fin, wherein the magnetic field is perpendicular in direction to the electrical current, and the magnetic field is generated at a low angle relative to the wafer surface to force the electrical current to flow towards the upper portion of the silicon fins; and detecting an electron flow of the electrical current concentrated at an upper portion of each of the silicon fins with a multiple point probe device.

* * * * *